(12) United States Patent
Kim

(10) Patent No.: US 7,684,256 B2
(45) Date of Patent: Mar. 23, 2010

(54) FLASH MEMORY DEVICE AND PROGRAM METHOD

(75) Inventor: Ki Seog Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 293 days.

(21) Appl. No.: 11/759,908

(22) Filed: Jun. 7, 2007

(65) Prior Publication Data

US 2008/0080236 A1 Apr. 3, 2008

(30) Foreign Application Priority Data

Sep. 29, 2006 (KR) .................. 10-2006-0096099

(51) Int. Cl.
*G11C 16/04* (2006.01)
(52) U.S. Cl. .................. 365/185.33; 365/185.09; 365/185.11; 365/185.17
(58) Field of Classification Search ............ 365/185.09, 365/185.11, 185.17, 185.33
See application file for complete search history.

(56) References Cited

U.S. PATENT DOCUMENTS

| 6,826,081 | B2 * | 11/2004 | Nagashima et al. ..... 365/185.09 |
| 2005/0141277 | A1 | 6/2005 | Furuyama |
| 2007/0297226 | A1 * | 12/2007 | Mokhlesi .................. 365/185.2 |

FOREIGN PATENT DOCUMENTS

KR    10-2005-0007653 A    1/2005

* cited by examiner

*Primary Examiner*—Hoai V Ho
*Assistant Examiner*—Fernando N Hidalgo
(74) *Attorney, Agent, or Firm*—Townsend and Townsend and Crew LLP

(57) ABSTRACT

A method for programming a flash memory device includes selecting bit lines connected to a plurality of memory strings and selecting a word line. A lower bit is programmed into the memory cells connected to the selected word line and programming a upper bit into the memory cells. The step of selecting the word line and the step of programming the upper bit are repeated.

5 Claims, 6 Drawing Sheets

FLASH MEMORY DEVICE AND PROGRAM METHOD

CROSS-REFERENCE TO RELATED APPLICATIONS

This application claims priority from Korean Patent Application No. 2006-96099, filed on Sep. 29, 2006, the contents of which are incorporated herein by reference in its entirety.

BACKGROUND OF THE INVENTION

The present invention relates to a flash memory device and, more particularly, to a programming method, in which an interference phenomenon between memory cells can be prevented.

FIG. 1 is a block diagram of a conventional flash memory device.

Referring to FIG. 1, the flash memory device includes a memory cell array 10 and page buffers P1 to Pn (n is an integer). The memory cell array 10 includes a plurality of cell strings Cle to Cne and Clo to Cno. Each of the plurality of cell strings Cle to Cne and Clo to Cno includes a plurality of memory cells (not shown) for storing data. The page buffers P1 to Pn are connected to the plurality of cell strings Cle to Cne and Clo to Cno through an even bit line BLe and an odd bit line BLo. In particular, one page buffer P1 is connected to the cell strings Cle and Clo through the even bit line BLe and the odd bit line BLo, forming a pair.

A general flash memory device operates as follows. The page buffer P1 is described as an example. The page buffer P1 is loaded with data to be programmed, and either the even bit line BLe or the odd bit line BLo is selected by a bit line selection unit (not shown). If the even bit line BLe is selected, a cell selected from cells included in the cell strings Cle connected to the even bit line BLe is programmed.

However, as the level of integration of a flash memory device increases, the line width decreases and the gap between memory cells becomes close. Thus, neighboring cells sharing the same word line are interfered by the voltage of the programmed cell. This phenomenon may occur in all structures of a Single Level Cell (SLC) and a Multi Level Cell (MLC). However, the interference phenomenon between memory cells becomes more profound in the MLC.

Threshold voltage distributions of the MLC are narrower than those of the SLC. In other words, assuming that the range of threshold voltages of the SLC is 1 V, the range of threshold voltages of the MLC is 0.2 to 0.6 V. This is because the MLC has four voltage states. Accordingly, the threshold voltage distribution is inevitably narrowed.

If any one threshold voltage distribution is widened due to the influence of neighboring cells, the threshold voltage distributions may overlap with other states. Furthermore, this phenomenon becomes more profound at the time of an odd page program operation following an even page program operation. This is because cells of a programmed even page are interfered by cells of an odd page that are programmed next. Accordingly, the reliability of devices may be significantly degraded.

BRIEF SUMMARY OF THE INVENTION

One embodiment of the present invention is directed to a method to reduce the interference between neighboring cells by performing a program operation on all cells sharing the same word line (i.e., programming on a word line basis).

The other embodiment of the present invention is directed to increasing area efficiency by sharing the page buffer between two cell strings when programming is performed on a word line basis.

In one embodiment, a method of programming a flash memory device includes the steps of selecting all bit lines connected to a plurality of memory strings, selecting a word line, programming a lower bit and upper bit into all memory cells connected to the selected word line, and repeating the step of selecting the word line and the step of programming the upper bit.

In another embodiment, a flash memory device includes a plurality of memory cell strings, each including a plurality of memory cells for storing data, and a plurality of page buffers connected to a plurality of memory cell strings through bit lines.

In still another embodiment, a flash memory device includes a first memory group including a plurality of memory strings, a second memory group having the same construction as that of the first memory group, and a page buffer group connected to the memory strings of the first memory group through even bit lines and to the memory strings of the second memory group through odd bit lines, and having the same number as that of the memory strings of the first or second memory group.

In still another embodiment, a method for programming a flash memory device includes the steps of providing a flash memory device comprising a first memory group having a plurality of memory strings, a second memory group having the same construction as that of the first memory group, and a page buffer group having the same number of the memory strings as those of the first or second memory group, selecting all bit lines of the first or second memory group, selecting word lines of a selected memory group, programming a lower bit into the entire memory cells connected to the selected word line, and then programming an upper bit into the entire memory cells, and repeating the step of selecting all bit lines of the first or second memory group to the step of programming the upper bit.

DESCRIPTION OF SPECIFIC EMBODIMENTS

Specific embodiments according to the present patent will be described with reference to the accompanying drawings.

Figure 1:
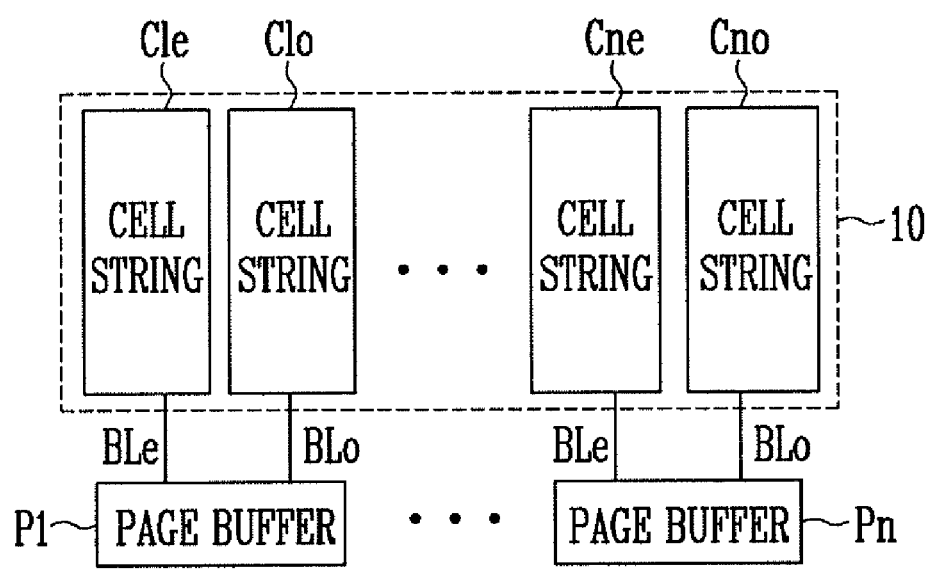
FIG. 1 is a block diagram of a conventional flash memory device.
Figure 2A:
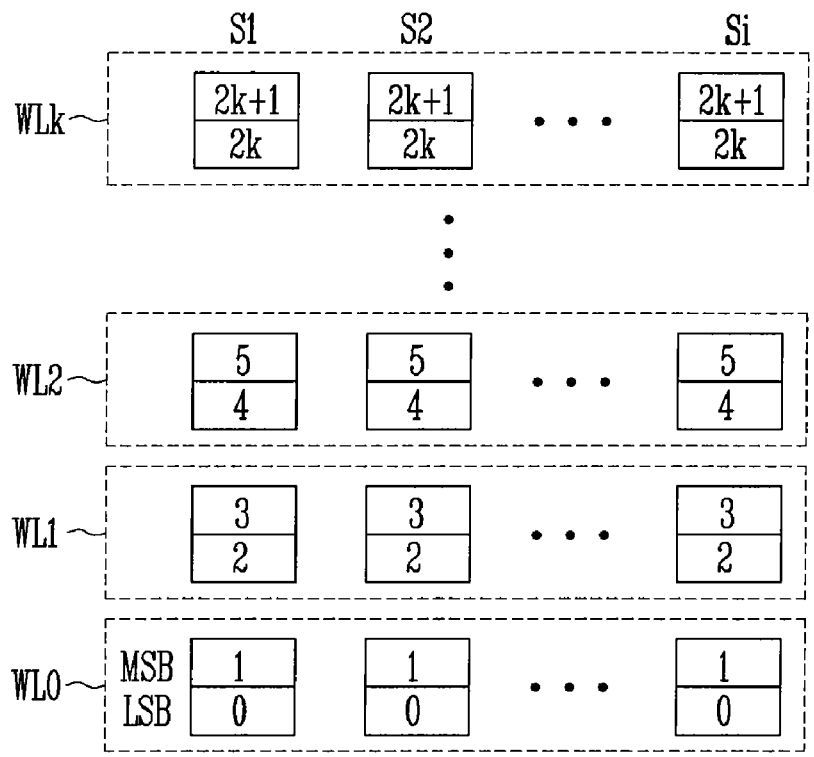
FIGS. 2A and 2B are a view illustrating a program method of a flash memory device according to an embodiment of the present invention.
Figure 2B:
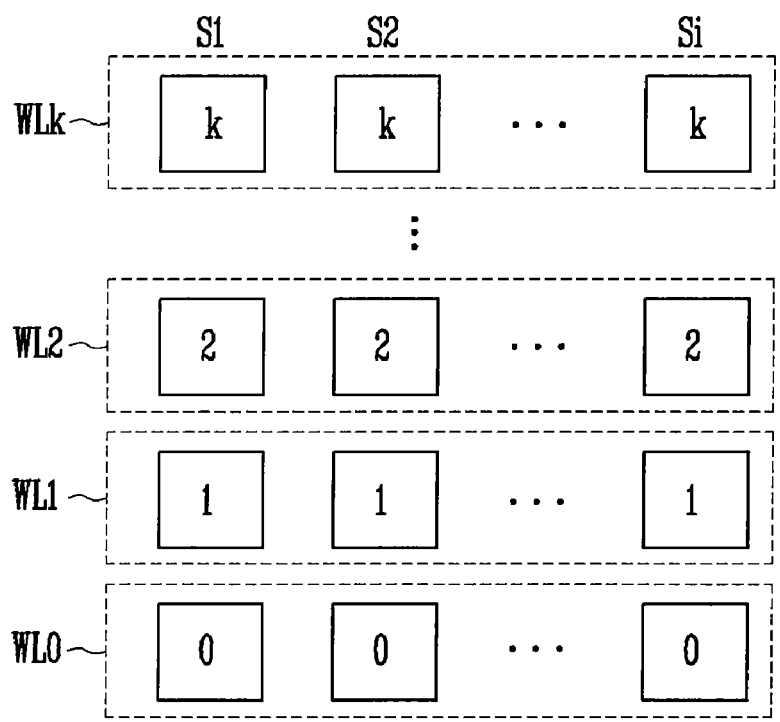

FIGS. 2A and 2B are a diagram illustrating a method for programming a flash memory device according to an embodiment of the present invention.

FIG. 2A illustrates a program method corresponds to a MLC including a plurality of memory cells connected to a plurality of memory cell strings S1 to Si and a plurality of word lines WL0 to WLk. The plurality of memory cell strings S1 to Si are all selected and the word lines WL0 to WLk are sequentially selected, so that all memory cells connected to the selected word lines are programmed at the same time. The MLC is programmed such that a Least Significant Bit (LSB) program is performed first and then a Most Significant Bit (MSB) program is performed.

For example, if a $0^{th}$ word line WL0 is selected, a lower bit is programmed (LSB; 0) into all memory cells connected to the $0^{th}$ word line WL0. A MSB voltage is applied to the same word line WL0, so that an upper bit is programmed (MSB; 1) into the word line WL0. Thereafter, a first word line is selected and the above program operation is repeated. In other words, the program can be performed on a word line basis in order to avoid the interference phenomenon with memory cells from a neighboring memory cell string. Memory cells sharing the word line are applied with a voltage of the same level through the same word line, and experience the program operation. Thus, the interference phenomenon between memory cells, at least in a word line direction, can be avoided.

FIG. 2B illustrates a program method of a single level cell including a plurality of memory cells connected to a plurality of memory cell strings S1 to Si and a plurality of word lines WL0 to WLk. If a program operation is performed in such a manner that corresponding voltage is applied to each of bit lines of the memory cell strings S1 to Si while the word lines WL0 to WLk are sequentially selected, all memory cells connected to the selected word lines are programmed at the same time.

For example, if a $0^{th}$ word line WL0 is selected and voltage is applied to bit lines connected to the memory cell strings S1 to Si, memory cells connected to the $0^{th}$ word line WL0 are programmed. In this manner, program is performed while the remaining first word line WL1 to the $k^{th}$ word line WLk are selected. Since memory cells sharing a selected word line are programmed at the same time, an interference phenomenon between memory cells in the word line direction can be removed.

Figure 3A:
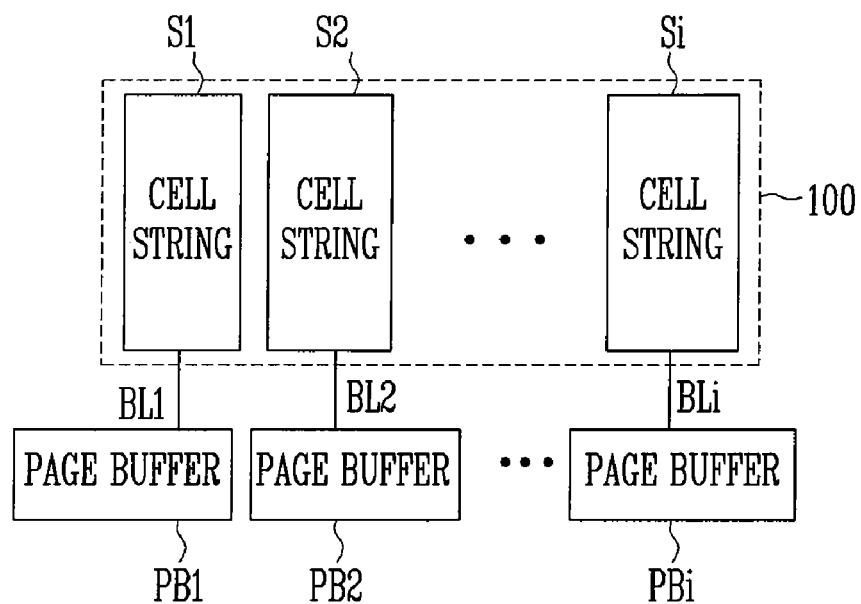
FIG. 3A is a block diagram of the flash memory device according to a first embodiment of the present invention.

FIG. 3A is a block diagram of a flash memory device according to a first embodiment of the present invention.

Referring to FIG. 3A, the flash memory device includes a memory cell array 100 having a plurality of cell strings S1 to Si (i is an integer). Each of the plurality of cell strings S1 to Si includes a plurality of memory cells (not shown) for storing data. The plurality of cell strings S1 to Si are connected to a plurality of page buffers PB1 to PBi, respectively, through bit lines BL1 to BLi. That is, one cell string corresponds to one page buffer. Accordingly, the page buffer and the cell string perform a program operation on a word line basis in a corresponding manner one by one. This is described below in detail with reference to FIG. 3B.

Figure 3B:
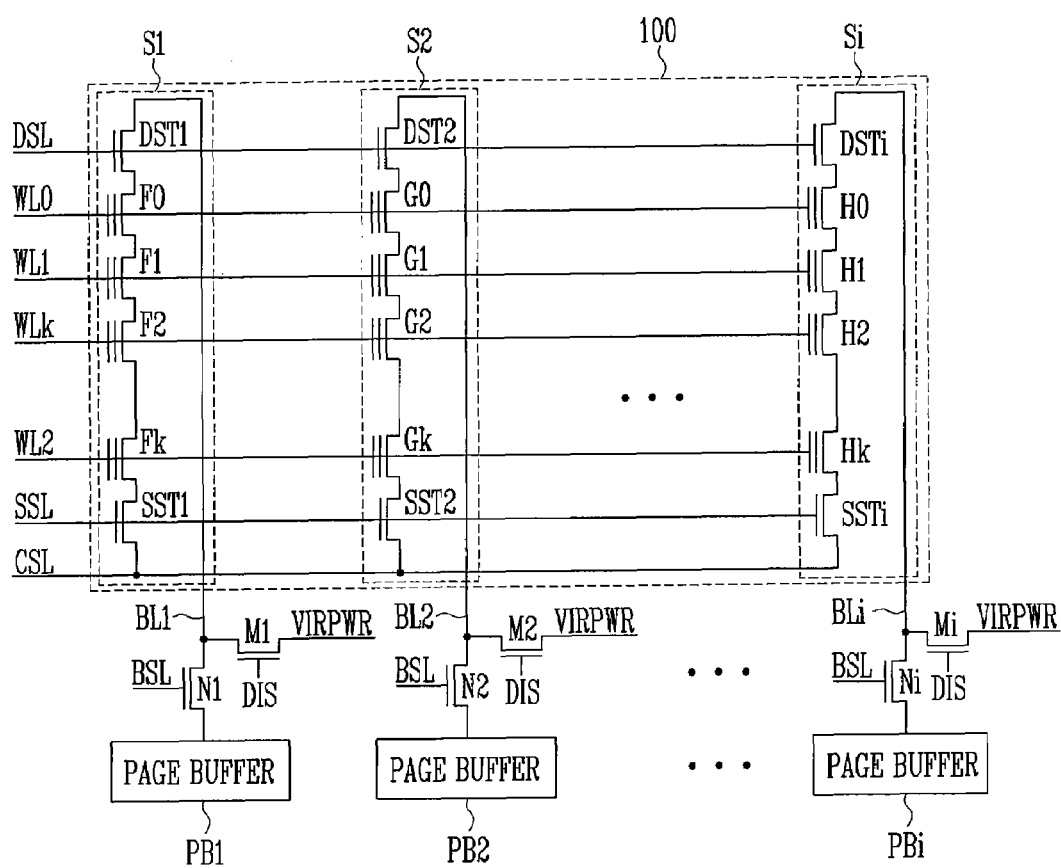
FIG. 3B is a detailed circuit diagram of FIG. 3A.

FIG. 3B is a detailed circuit diagram of FIG. 3A.

The memory cell array 100 includes the plurality of cell strings S1 to Si. The cell strings S1 includes a drain select transistor DST1, a source select transistor SST1 and a plurality of memory cells F0 to Fk (k is an integer). The cell strings S2 includes a drain select transistor DST2, a source select transistor SST2 and a plurality of memory cells G0 to Gk. The cell strings Si includes a drain select transistor DSTi, a source select transistor SSTi and a plurality of memory cells H0 to Hk. The plurality of page buffers PB1 to Pbi connect to the plurality of bit lines BL1 to BLi, respectively. That is, one page buffer is connected to one bit line. The bit lines are connected to a plurality of NMOS transistors M1 to Mi, respectively, and are charged with a high voltage VIRPWR according to a high voltage control signal DIS. The plurality of NMOS transistors N1 to Ni connect the bit line and a corresponding page buffer in response to the bit line select signal BSL. The program operation is described below.

One word line WL0 will be described as an example. The program operation is performed on a plurality of memory cells F0, G0, . . . , H0 sharing the word line WL0. That is, if data is input to each of the plurality of page buffers PB1 to PBi and the bit line select signal BSL is enabled to turn on the NMOS transistors N1 to Ni, the data is programmed into all memory cells F0 to H0 sharing the word line WL0.

Therefore, although memory cells F0 and G0 are in close proximity to each other, the memory cells F0 and G0 are programmed at the same time. Thus, the interference phenomenon between memory cells sharing the same word line is not generated. Furthermore, threshold voltage distributions become very narrow since the interference phenomenon between the memory cells F0 and G0 neighboring in the word line direction is removed. In addition, since the plurality of memory cells can be programmed at the same time, the speed of the program operation can be increased.

Figure 4A:
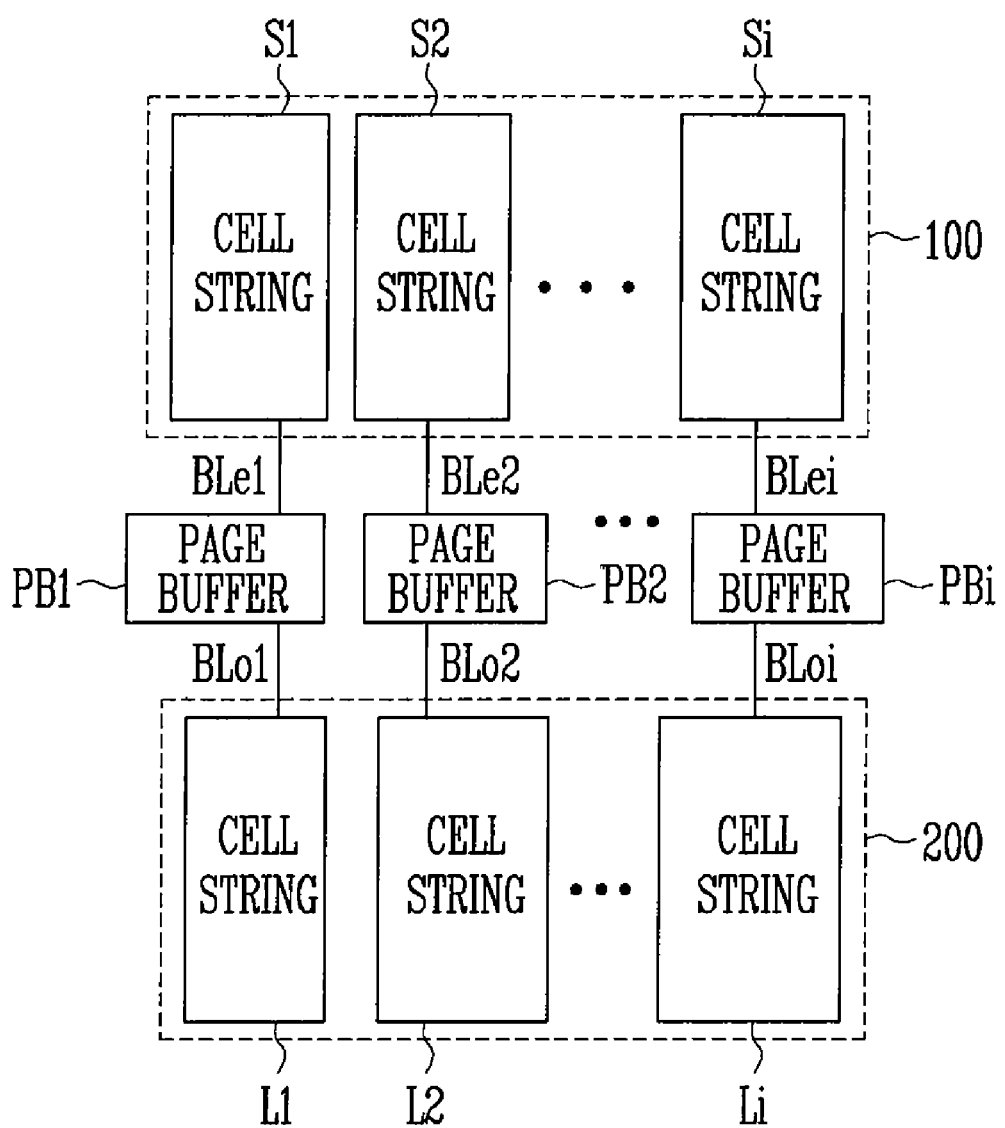
FIG. 4A is a block diagram of the flash memory device according to a second embodiment of the present invention.

FIG. 4A is a block diagram of the flash memory device according to a second embodiment of the present invention. According to the embodiment of FIG. 3B, the interference phenomenon between the memory cells is reduced, but the area is increased since each cell string requires its own page buffer. Thus, a memory cell array sharing the plurality of page buffers may be further included in order to increase the area efficiency.

The plurality of page buffers PB1 to PBi form pairs with two memory cell arrays 100 and 200. The memory cell array 100 includes a plurality of cell strings S1 to Si. The memory cell array 200 includes a plurality of cell strings L1 to Li. Page buffers PB1 to PBi are disposed between the cell strings S1 to Si and the cell strings L1 to Li so that the cell strings S1 to Si and the cell strings L1 to Li are symmetrical to each other. Each of the cell arrays S1 to Si share a page buffer PB1 to PBi with each of the cell arrays L1 to Li as can be seen in FIG. 4A. That is, since two cell strings share one page buffer, the increase in chip area can be compensated for. This is described below in more detail.

Figure 4B:
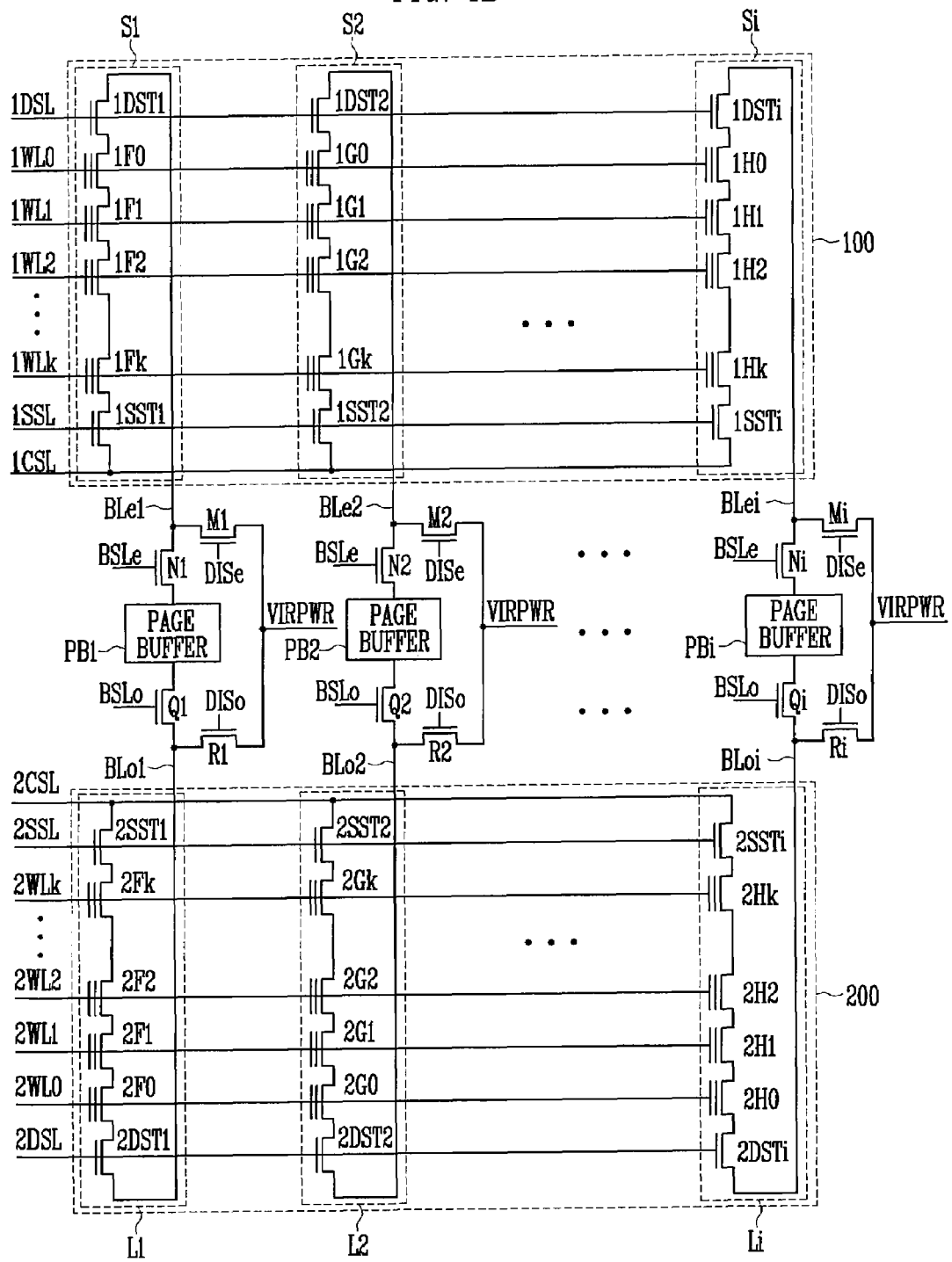
FIG. 4B is a detailed circuit diagram of FIG. 4A.

FIG. 4B is a detailed circuit diagram of FIG. 4A. The plurality of page buffers PB1 to PBi are arranged between the two memory cell arrays 100 and 200. That is, the two memory cell arrays 100 and 200 are symmetrical in relation to the plurality of page buffers PB1 to PBi.

The memory cell array 100 includes the plurality of cell strings S1 to Si. The plurality of cell strings S1 to Si include drain select transistors 1DST1 to 1DSTi, source select transistors 1SST1 to 1SSTi and a plurality of memory cells 1F0 to 1Fk, 1G0 to 1Gk . . . 1H0 to 1Hk, respectively. The memory cell array 200 includes a plurality of cell strings L1 to Li. The plurality of cell strings L1 to Li include drain select transistors 2DST1 to 2DSTi, source select transistors 2SST1 to 2SSTi, and a plurality of memory cells 2F0 to 2Fk, 2G0 to 2Gk . . . 2H0 to 2Hk, respectively.

The flash memory device further includes a plurality of NMOS transistors N1 to Ni and Q1 to Qi connected between the page buffer and the cell string, for selecting the bit line. The flash memory device further includes a plurality of NMOS transistors M1 to Mi and R1 to Ri for applying a high voltage to each of the bit lines BLei to BLei and BLo1 to BLoi. To avoid repetition, only one page buffer PB1 and the cell strings S1 and L1 corresponding to the page buffer PB1 are described below as an example.

If each of the plurality of page buffers PB1 to PBi receives program data, either the even bit lines BLe1 to BLei or the odd bit lines BLo1 to BLoi are selected, and the program operation is performed. This is decided by turning on one of the NMOS transistors N1 to Ni and Q1 to Qi on the even bit line region and the odd bit line region. If voltage is applied to the word line 1WL1 and memory cells 1F1, 1G1, . . . , 1H1 are selected and programmed, the odd memory cells 2F1, 2G1, . . . , 2H1 on the opposite side are not programmed.

At this time, in the case of two neighboring memory cells 1F1 and 1G1 that are programmed, the interference phenomenon between cells on the same cell string exists, but the interference phenomenon between cells on the same word line is removed. This is because all memory cells 1F1, 1G1, . . . , 1H1 sharing the same word line 1WL1 are programmed at the same time.

Furthermore, the program speed can be enhanced by making the respective cell strings and page buffers correspond to each other 1:1 in order to perform an independent program operation.

The following Table lists values depending on the program method of the present invention and a conventional program method.

|  |  | Conventional | Present Invention | Conventional | Present Invention |
|---|---|---|---|---|---|
| Tech |  | 52 nm | | 45 nm | |
| Chip | size | 11 * 15.4 = 169 mm² | 8.3 * 20.4 = 170 mm² | 9.9 * 14 = 139 mm² | 7.5 * 18.5 = 139 mm² |
|  | page | 4 kB | 8 kB | 4 kB | 8 kB |
| Interference | "01" | 0.41 | 0.14 | 0.45 | 0.16 |
|  | "10" | 0.41 | 0.28 | 0.45 | 0.3 |
|  | "00" | 0.41 | 0.41 | 0.45 | 0.16 |
| PGM | page | 521 μs | 521 μs | 536 μs | 536 μs |
|  | PGM | | | | |
|  | 1 plane | 6.3 MB/s | 10.5 MB/s | 6.1 MB/s | 10.3 MB/s |
|  | 2 plane | 10.5 MB/s |  | 10.3 MB/s | |
| PGM disturb (NOP) |  | 4 | 3 | 4 | 2 |
| Vread |  | 6.6 V | 6.0 V | 6.8 V | 6.0 V |

The values listed in the Table are presented to help in the understanding of the present invention. It is to be noted that the present invention is not limited to the above values.

First, technology is divided into 52 nm and 45 nm in order to compare the present invention with the prior art. From the 52 nm technology of the present invention, it can be seen that the chip size is not increased. At the time of loading onto the word line, the number of pages can be doubled to 8 kB, and the program operation can be improved accordingly.

The conventional interference was 0.41+0.41+0.41=1.2 depending on threshold voltage distributions (01, 10 and 00). The interference phenomenon of the present invention was 0.4+0.28+0.17=0.56. Accordingly, the interference phenomenon of the present invention was reduced by half in comparison with the conventional interference.

In particular, in the present invention, PGM disturb, which becomes the greatest obstacle in securing the yield of products, can be reduced by half in comparison with the prior art. Furthermore, the read voltage Vread can be decreased, and therefore a stabilized program operation can be performed.

It can also be seen that the similar improvements in the 52 nm technology were obtained in the 45 nm technology.

As described above, the flash memory device and the program method according to the present invention have the following advantages.

First, all memory cells sharing a word line are programmed at the same time. It is therefore possible to prevent an interference phenomenon between neighboring cells.

Second, since the program disturbance phenomenon is reduced, the yield of flash memory devices is increased.

Third, since two cell strings share one page buffer, an increase in chip size can be prevented.

The above embodiments of the present invention are illustrative and various alternatives and equivalents are possible. Other additions, subtractions, or modifications are obvious in view of the present disclosure and are intended to fall within the scope of the appended claims.

What is claimed is:

1. A flash memory device comprising:
a first memory group having a plurality of memory strings;
a second memory group having the same structure as that of the first memory group; and
a page buffer group having the same number of page buffers as the number of the memory strings of the first memory group or the number of memory strings of the second memory group, wherein one memory string of the first memory group and one memory string of the second memory group are oppositely connected to a corresponding page buffer of the page buffer group;
a plurality of first switching elements respectively connected to the plurality of memory strings in the first memory group, wherein the first switching elements are configured to supply a power supply voltage to the plurality of the memory strings in the first memory group according to a first signal;
a plurality of second switching elements connected between the page buffer group and the plurality of memory strings in the first memory group, wherein the second switching elements are configured to turned on or off in response to a second signal;
a plurality of third switching elements respectively connected to the plurality of memory strings in the second memory group, wherein the third switching elements are configured to supply the power supply voltage to the plurality of memory strings in the second memory group according to a third signal; and
a plurality of fourth switching elements connected between the page buffer group and the plurality of memory strings in the second memory group, wherein the fourth switching elements are configured to turned on or off in response to a fourth signal.

2. The flash memory device of claim 1, wherein each of the first to fourth switching elements comprises an NMOS transistor.

3. A program method of a flash memory device, comprising the steps of:
providing a flash memory device including:
a first memory group having a plurality of memory strings,
a second memory group having the same structure as that of the first memory group, a page buffer group having the same number of page buffers as the number of memory strings of the first memory group or the number of memory strings of the second memory group, wherein one memory string of the first memory group and one memory string of the second memory group are oppositely connected to a corresponding page buffer of the page buffer group, a plurality of first switching elements respectively connected to the plurality of memory strings in the first memory group, wherein the first switching elements are configured to supply a power supply voltage to the plurality of the memory strings in the first memory group according to a first signal, a plurality of second switching elements connected between the page buffer group and the plurality of memory strings in the first memory group, wherein the second switching elements are configured to turned on or off in response to a second signal, a plurality of third switching elements respectively connected to the plurality of memory strings in the second memory group, wherein the third switching elements are configured to supply the power supply voltage to the plurality of memory strings in the second memory group according to a third signal, and a plurality of fourth switching elements connected between the page buffer group and the plurality of memory strings in the second memory group, wherein the fourth switching elements are configured to turned on or off in response to a fourth signal;

selecting bit lines connected to the plurality of memory strings in the first memory group or the plurality of memory strings in the second memory group through the second and fourth switching elements;

selecting a word line of the first memory group or the second memory group; and performing a programming operation.

4. The program method of the flash memory device of claim 1, wherein the memory strings of the first memory group are each connected to an even bit line and the memory strings of the second memory group are each connected an odd bit line.

5. The program method of the flash memory device of claim 3, wherein the programming operation comprises the steps of:

programming a lower bit of the selected word line; and
programming an upper bit of the selected word line.

* * * * *